(12) United States Patent
Haruna

(10) Patent No.: US 11,012,038 B2
(45) Date of Patent: May 18, 2021

(54) POWER AMPLIFIER

(71) Applicant: Mitsubishi Electric Corporation, Tokyo (JP)

(72) Inventor: Takao Haruna, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/323,505

(22) PCT Filed: Jan. 12, 2017

(86) PCT No.: PCT/JP2017/000781
§ 371 (c)(1),
(2) Date: Feb. 5, 2019

(87) PCT Pub. No.: WO2018/131110
PCT Pub. Date: Jul. 19, 2018

(65) Prior Publication Data
US 2019/0326863 A1    Oct. 24, 2019

(51) Int. Cl.
| H03F 3/191 | (2006.01) |
| H03F 1/56 | (2006.01) |
| H03F 3/21 | (2006.01) |
| H03F 3/60 | (2006.01) |

(52) U.S. Cl.
CPC .............. *H03F 1/56* (2013.01); *H03F 3/191* (2013.01); *H03F 3/21* (2013.01); *H03F 3/601* (2013.01); *H03F 2200/255* (2013.01); *H03F 2200/423* (2013.01); *H03F 2200/451* (2013.01)

(58) Field of Classification Search
CPC ... H03F 1/56; H03F 3/601; H03F 3/21; H03F 2200/451; H03F 2200/423; H03F 2200/255; H03F 3/60; H03F 3/24; H04B 1/04

USPC .......................................... 330/286, 302–306
See application file for complete search history.

(56) References Cited

U.S. PATENT DOCUMENTS

| 5,886,595 A * | 3/1999 | Von Stein .............. H03B 19/14 327/123 |
| 6,759,908 B2 * | 7/2004 | Gotou ................... H03F 1/0205 330/302 |
| 2007/0296505 A1 | 12/2007 | Oka et al. |

FOREIGN PATENT DOCUMENTS

| JP | 2001-053510 A | 2/2001 |
| JP | 2007-306299 A | 11/2007 |
| JP | 2009-159591 A | 7/2009 |
| JP | 2011-035761 A | 2/2011 |
| JP | 2012-205246 A | 10/2012 |

OTHER PUBLICATIONS

International Search Report; Written Opinion; and Notification of Transmittal of the International Search Report and the Written Opinion of the International Searching Authority, or the Declaration issued in PCT/JP2017/000781; dated Apr. 4, 2017.

(Continued)

*Primary Examiner* — Khanh V Nguyen
*Assistant Examiner* — Khiem D Nguyen
(74) *Attorney, Agent, or Firm* — Studebaker & Brackett PC

(57) ABSTRACT

A plurality of transmission lines (3b,3c) are connected to a transistor (1) and have different characteristic impedances. A plurality of open stubs (4a,4b) are connected to the plurality of transmission lines (3b,3c) respectively. A length of each open stub (4a,4b) is shorter than a length of each transmission line (3b,3c).

9 Claims, 8 Drawing Sheets

(56) References Cited

OTHER PUBLICATIONS

Kenle Chen, Student Member, IEEE, and Dimitrios Peroulis, Member, IEEE "Design of Highly Efficient Broadband Class-E Power Amplifier Using Synthesized Low-Pass Matching Networks", IEEE Transactions on Microwave Theory and Techniques, vol. 59, No. 12, Dec. 2011.

An Office Action mailed by the Korean Intellectual Property Office dated Dec. 14, 2020, which corresponds to Korean Patent Application No. 10-2019-7019380 and is related to U.S. Appl. No. 16/323,505 with English language translation.

* cited by examiner

POWER AMPLIFIER

FIELD

The present invention relates to a power amplifier.

BACKGROUND

A high frequency power amplifier is used for a communication device in a microwave band or millimeter wave band, for example, from several MHz to several hundreds of GHz for mobile communication, satellite communication or the like. FIG. 13 is a diagram showing the amount of variation in power-added efficiency (PAE) of a transistor in a conventional power amplifier. Here, the impedance of the second harmonic is fixed at $\Gamma=0.8$, and the harmonic phase is changed from 0 to 360°. It can be seen that the PAE varies by nearly 20% depending on the phase. Therefore, it is important to control the harmonic impedance of the second harmonic, etc. of the power amplifier.

In a power amplifier, PAE of a transistor is enhanced by using a harmonic circuit for reflecting harmonics. In the harmonic circuit, it is necessary to set odd harmonics such as the third harmonic to open impedance in the case of a class F operation, and also it is necessary to set even harmonics of the second and higher harmonics to open impedance in the case of an inverse class F operation (for example, see PTL 1 to PTL 3). In order to enhance PAE in a broad band, it is necessary to control not only a fundamental wave as an operating frequency of the power amplifier, but also the impedance of harmonics in a broad band. Therefore, a trap circuit or a short circuit has been added (for example, see PTL 4 and PTL 5).

CITATION LIST

Patent Literature

[PTL 1] JP 2012-205246 A
[PTL 2] JP 2009-159591 A
[PTL 3] JP 2001-53510 A
[PTL 4] JP 2007-306299 A
[PTL 5] JP 2011-035761 A

SUMMARY

Technical Problem

In the conventional power amplifier, a circuit for controlling harmonics of the power amplifier is added to an output matching circuit for a high efficiency operation. However, in the case of a power amplifier having a broad operating band, an added circuit area increases, which causes an obstacle to miniaturization. Also, a trap circuit which is often used for harmonic control enables a short circuit to be configured in a compact size, but has a problem that a transmission loss is relatively large.

The present invention has been made to solve the problem as described above, and has an object to obtain a power amplifier that includes a matching circuit having a broad band and a compact size and can operate with high efficiency.

Solution to Problem

A power amplifier according to the present invention includes: a transistor; a plurality of transmission lines connected to the transistor and having different characteristic impedances; and a plurality of open stubs connected to the plurality of transmission lines respectively, wherein a length of each open stub is shorter than a length of each transmission line.

Advantageous Effects of Invention

In the present invention, by providing the open stubs in the plurality of transmission lines respectively, the impedance of harmonics of the power amplifier can be gathered to open. As a result, a high efficiency operation can be performed in a broad band. In addition, only the open stubs are provided, it is unnecessary to provide a trap circuit, a short circuit, or the like. As a result, it is possible to realize a power amplifier that includes a matching circuit having a broad band and a compact size and can operate with high efficiency.

DESCRIPTION OF EMBODIMENTS

A power amplifier according to the embodiments of the present invention will be described with reference to the drawings. The same components will be denoted by the same symbols, and the repeated description thereof may be omitted.

First Embodiment

Figure 1:
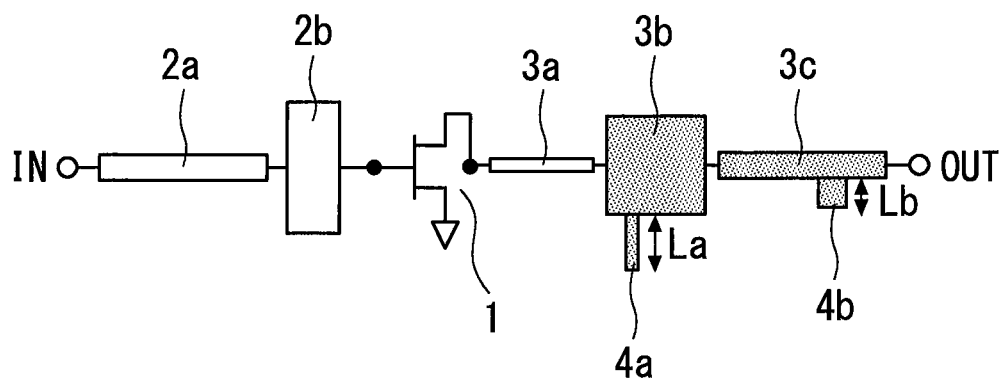
FIG. 1 is a diagram showing a power amplifier according to a first embodiment of the present invention.

FIG. 1 is a diagram showing a power amplifier according to a first embodiment of the present invention. Transmission lines 2a and 2b having different characteristic impedances are connected in series between an input terminal IN and the gate of a transistor 1. Transmission lines 3a, 3b, and 3c having different characteristic impedances are connected in series between the drain of the transistor 1 and an output terminal OUT. The impedance of the fundamental waves of the power amplifier is matched by the transmission lines 3a, 3b, and 3c so that the transistor 1 operates with high efficiency.

Open stubs 4a and 4b are connected to the transmission lines 3b and 3c, respectively. The length La of the open stub 4a is set to ¼ of wavelengths from the wavelength $\lambda_{2fL}$ on a low frequency band side of the second harmonic to the center frequency $\lambda_{2fC}$ of the second harmonic, that is, ranges from $\lambda_{2fL}/4$ to $\lambda_{2fC}/4$. The length Lb of the open stub 4b is set to ¼ of wavelengths from the wavelength $\lambda_{2fH}$ on a high frequency band side of the second harmonic to the center frequency $\lambda_{2fC}$ of the second harmonic, that is, ranges from $\lambda_{2fH}/4$ to $\lambda_{2fC}/4$. Since the respective lengths of the open stubs 4a and 4b are equal to ¼ of the wavelengths of the second harmonic, the lengths are shorter than the length of each of the transmission lines 3a, 3b, and 3c through which the fundamental wave propagates.

In the case of the inverse class F operation, in order to operate the power amplifier with high efficiency, it is necessary to match even harmonics of the second or higher harmonics of the power amplifier to open impedance. Here, an example in which the second harmonic of the power amplifier is matched with the open impedance will be described, and the operation of the present embodiment will be described in comparison with a comparative example.

Figure 2:
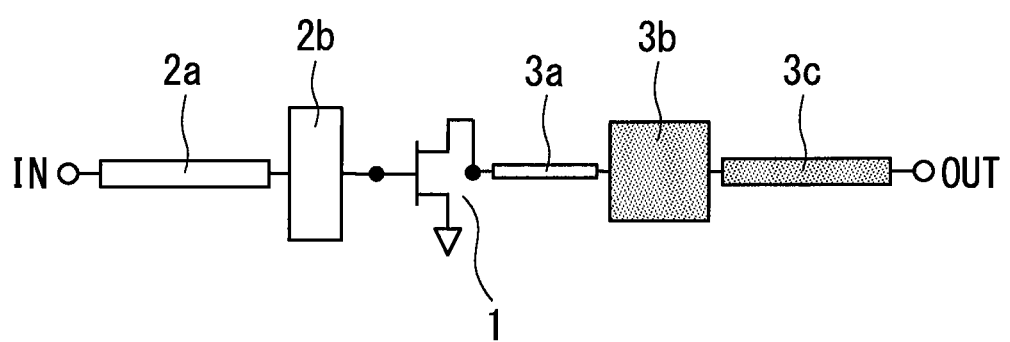
FIG. 2 is a diagram showing a power amplifier according to a comparative example.
Figure 3:
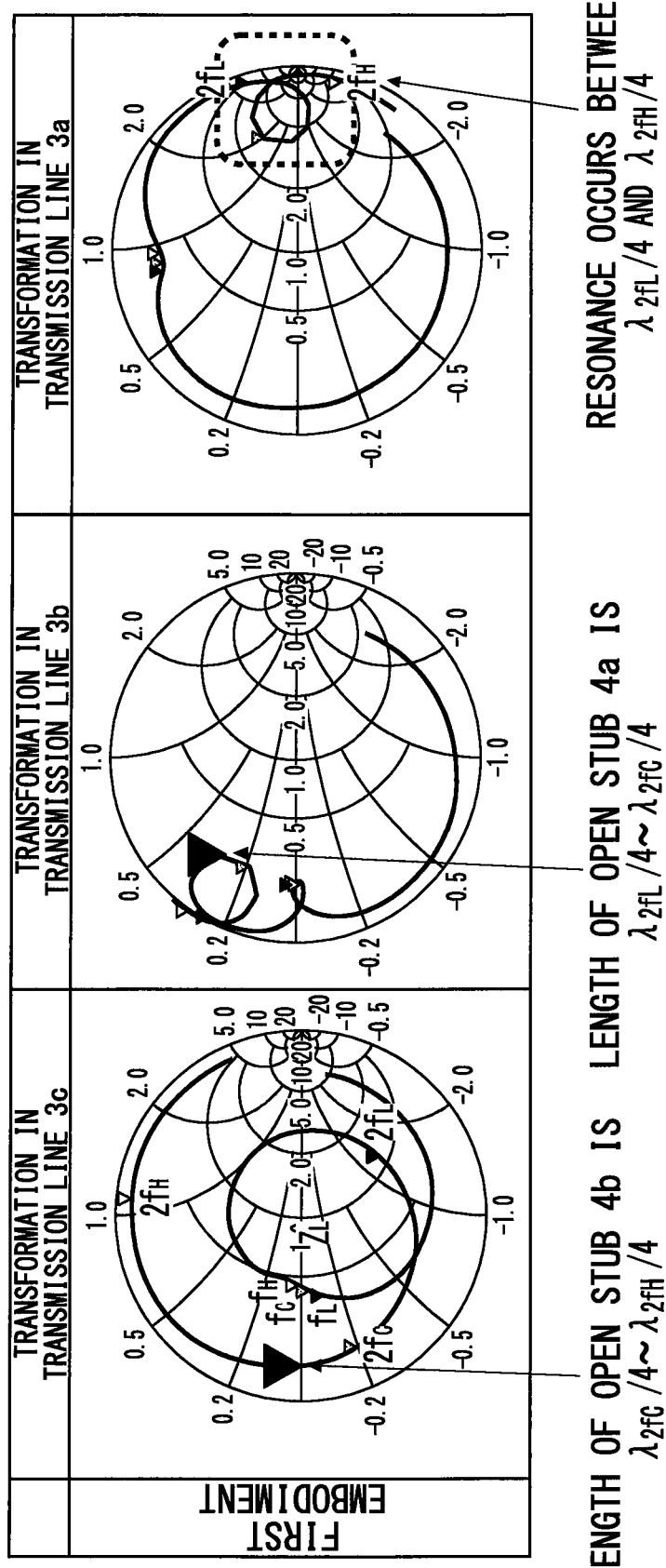
FIG. 3 is a diagram showing an example of impedance transformation of the second harmonic of the power amplifier according to the first embodiment of the present invention.
Figure 4:
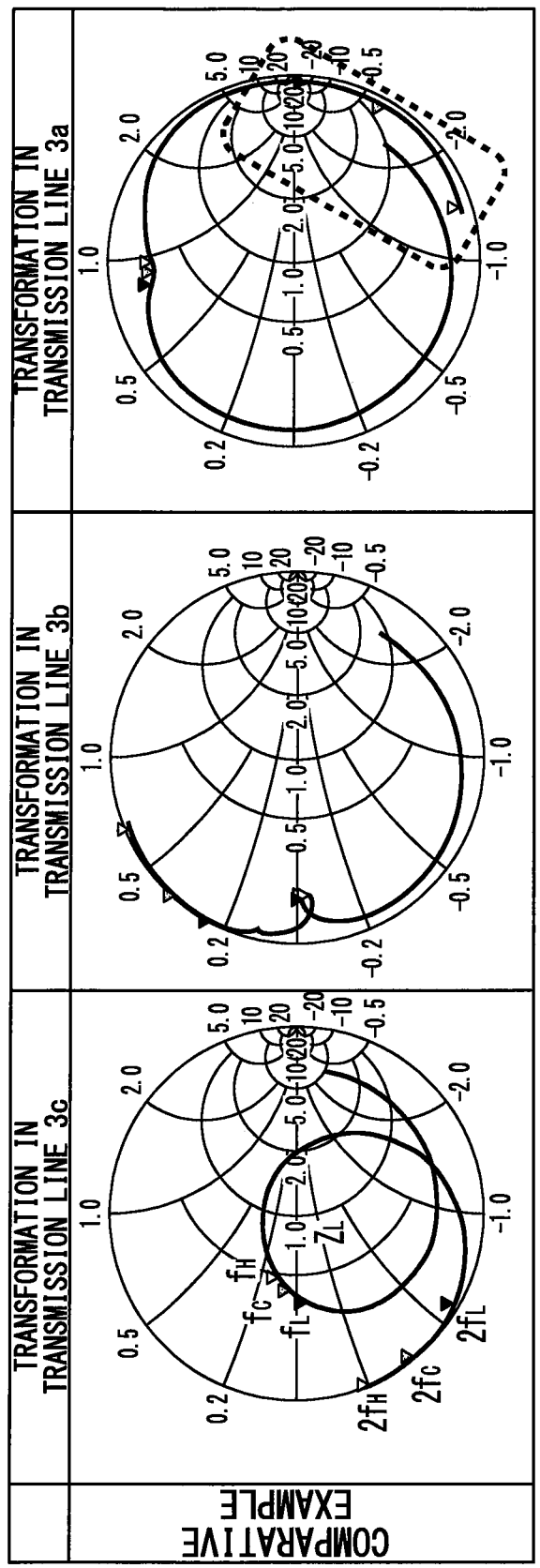
FIG. 4 is a diagram showing an example of impedance transformation of the second harmonic of the power amplifier according to the comparative example.

FIG. 2 is a diagram showing a power amplifier according to a comparative example. In the comparative example, the open stubs 4a and 4b are not provided. FIG. 3 is a diagram showing an example of impedance transformation of the second harmonic of the power amplifier according to the first embodiment of the present invention. FIG. 4 is a diagram showing an example of impedance transformation of the second harmonic of the power amplifier according to the comparative example. $f_L$ represents a frequency on a low frequency band side of the fundamental wave, $f_C$ represents the center frequency of the fundamental wave, $f_H$ represents a frequency on a high frequency band side of the fundamental wave, $2f_L$ represents a frequency on a low frequency band side of the second harmonic, $2f_C$ represents the center frequency of the second harmonic, and $2f_H$ represents a frequency on a high frequency band side of the second harmonic.

First, λ/4 transformation of the fundamental wave of the power amplifier is performed in the transmission line 3c. At this time, in the present embodiment, the phase is rotated by the open stub 4b to move the impedance of the second harmonic of the power amplifier. Next, λ/4 transformation of the fundamental wave of the power amplifier is also performed in the transmission line 3b. At this time, the impedance of the second harmonic of the power amplifier is moved by the open stub 4a. Therefore, as shown in FIG. 3, resonance occurs at the impedance of the second harmonic of the power amplifier in the present embodiment. On the other hand, in the comparative example which does not use the open stubs 4a and 4b, it is understood that no resonance occurs as shown in FIG. 4.

The band of the second harmonic can be adjusted by the lengths of the open stubs 4a and 4b. Moreover, by using the transmission lines 3b and 3c having different characteristic impedances, an open stub of the second harmonic on a high frequency band side of the power amplifier is provided on a transmission line having a high characteristic impedance, and an open stub of the second harmonic on a low frequency band side is provided on a transmission line having a low characteristic impedance, whereby it is easy to make the above-described resonance without enlarging the open stub.

Finally, the phase is rotated in the transmission line 3a to match the fundamental wave of the power amplifier with a desired impedance. At this time, as shown in FIG. 4, in the comparative example, the impedance of the second harmonic of the power amplifier is not gathered to open. On the other hand, as shown in FIG. 3, in the present embodiment, it is found that the impedance of the second harmonic of the power amplifier is gathered to open in a broad band.

As described above, in the present embodiment, by providing the open stubs 4a and 4b in the transmission lines 3b and 3c, the impedance of the second harmonic of the power amplifier can be gathered to open. As a result, a transistor 1 can be operated in the inverse F class in a broad band, and a high efficiency operation can be performed in a broad band. In addition, only the open stubs 4a and 4b are provided, it is unnecessary to provide a trap circuit, a short circuit, or the like, and a manufacturing method is also facilitated. As a result, it is possible to realize a power amplifier that includes a matching circuit having a broad band and a compact size and can operate with high efficiency.

In the present embodiment, the open stubs 4a and 4b are provided in the transmission lines 3b and 3c which are output matching circuits, but open stubs may be provided in the transmission lines 2a and 2b which are input matching circuits.

Second Embodiment

Figure 5:
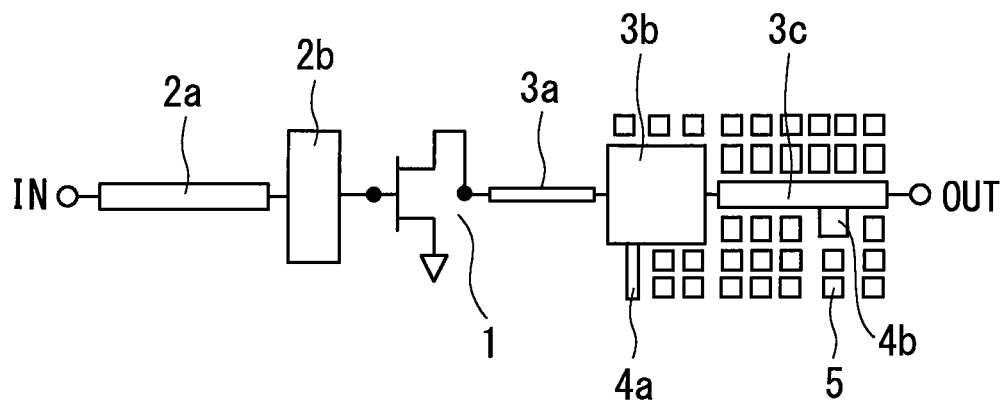
FIG. 5 is a diagram showing a power amplifier according to a second embodiment of the present invention.

FIG. 5 is a diagram showing a power amplifier according to a second embodiment of the present invention. Ungrounded conductive patterns 5 are arranged around the transmission lines 3b and 3c and the open stubs 4a and 4b. By arranging a number of conductive patterns 5 to be close to the transmission lines 3b and 3c and the open stubs 4a and 4b, it is possible to cause more capacitance components to appear. On the other hand, by arranging a small number of conductive patterns 5 to be apart from the transmission lines 3b and 3c and the open stubs 4a and 4b, it is possible to cause a few capacitance components to appear. Thus, it is possible to enhance the degree of freedom of adjusting the impedance of the second harmonic of the power amplifier. This function is effective particularly at high frequencies. Although the ungrounded conductive pattern 5 has a quadrangular shape, it may have other shapes.

Figure 6:
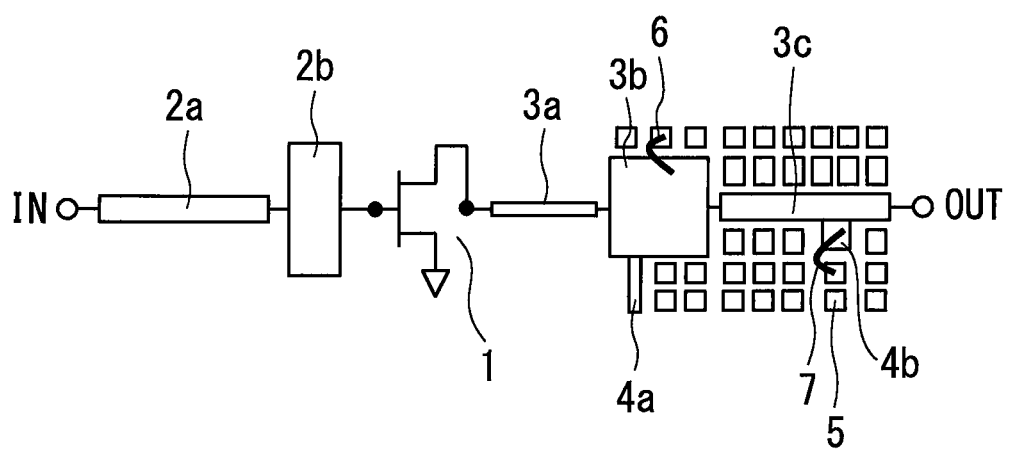
FIG. 6 is a diagram showing a modification of the power amplifier according to the second embodiment of the present invention.

FIG. 6 is a diagram showing a modification of the power amplifier according to the second embodiment of the present invention. The ungrounded conductive pattern 5 and the transmission line 3b are connected to each other by a wire 6. The ungrounded conductive pattern 5 and the open stub 4b are connected to each other by a wire 7. Even in this case, the above effect can be obtained. Also in the present embodiment, it is possible to realize a power amplifier that includes a matching circuit having a broad band and a compact size and can operate with high efficiency as in the case of the first embodiment.

Third Embodiment

Figure 7:
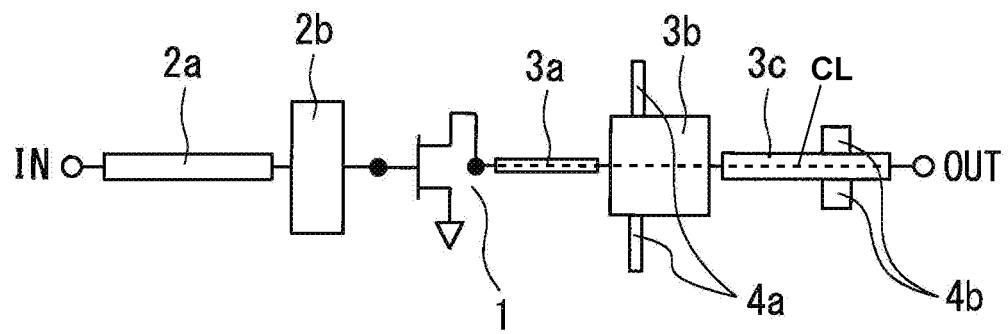
FIG. 7 is a diagram showing a power amplifier according to a third embodiment of the present invention.

FIG. 7 is a diagram showing a power amplifier according to a third embodiment of the present invention. Open stubs 4a are arranged symmetrically with respect to the center line of the transmission line 3b. Furthermore, open stubs 4b are arranged symmetrically with respect to the center line of the transmission line 3c. This makes it possible to make the impedances in the transmission lines 3a, 3b, and 3c more uniform.

In particular, in a power amplifier in which transistors are connected in parallel, the transmission line is often thick and branched into plural parts. When the impedance of the transmission line becomes non-uniform in that state, the transistors connected in parallel tend to cause non-uniform operation, which degrades the performance of the power amplifier or causes abnormal operation. In contrast, the uniformity of the impedance is enhanced by arranging the open stubs symmetrically with respect to the center line of the transmission line, so that the above problem hardly occurs. Also in the present embodiment, it is also possible to realize a power amplifier that includes a matching circuit having a broad band and a compact size and can operate with high efficiency as in the case of the first embodiment.

Fourth Embodiment

Figure 8:
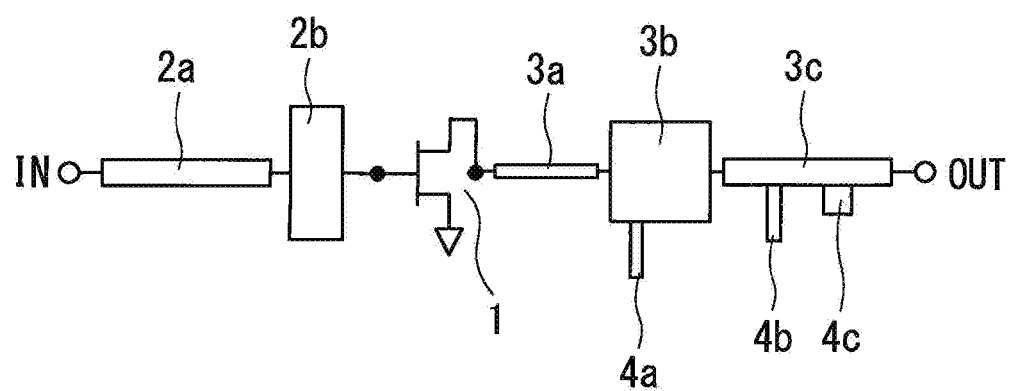
FIG. 8 is a diagram showing a power amplifier according to a fourth embodiment of the present invention.

FIG. 8 is a diagram showing a power amplifier according to a fourth embodiment of the present invention. Two open stubs 4b and 4c having different lengths are connected to the transmission line 3c. Two open stubs having different lengths may be connected to each transmission line.

Figure 9:
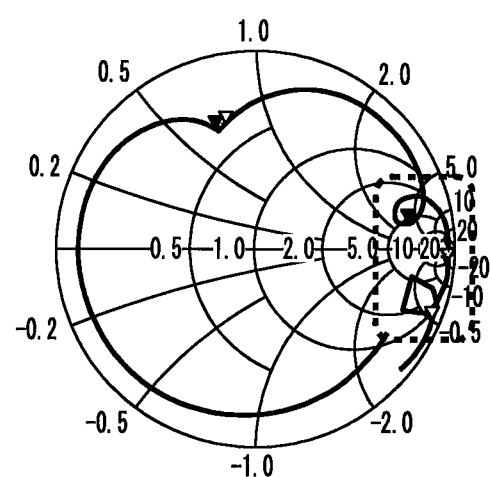
FIG. 9 is a diagram showing an impedance transformation result of the output matching circuit of the power amplifier according to a fourth embodiment of the present invention.

FIG. 9 is a diagram showing an impedance transformation result of the output matching circuit of the power amplifier according to a fourth embodiment of the present invention. It can be seen that resonation also occurs on the high frequency band side of the second harmonic of the power amplifier. As resonance occurs at two places, the high frequency band expands.

Since the resonant frequency changes according to the length $\lambda_2/4$ of the open stub, the frequency band of the second harmonic of the power amplifier in which resonance occurs can be expanded by increasing the number of open stubs. Therefore, the impedance of the second harmonic of the power amplifier can be gathered to open in a broader band as compared with the first embodiment. Therefore, it is possible to cause the transistor to perform the inverse F class operation in a broad band, and a high-efficiency operation can be performed in a broader band. Also in the present embodiment, the matching circuit can be also miniaturized as in the case of the first embodiment.

Fifth Embodiment

Figure 10:
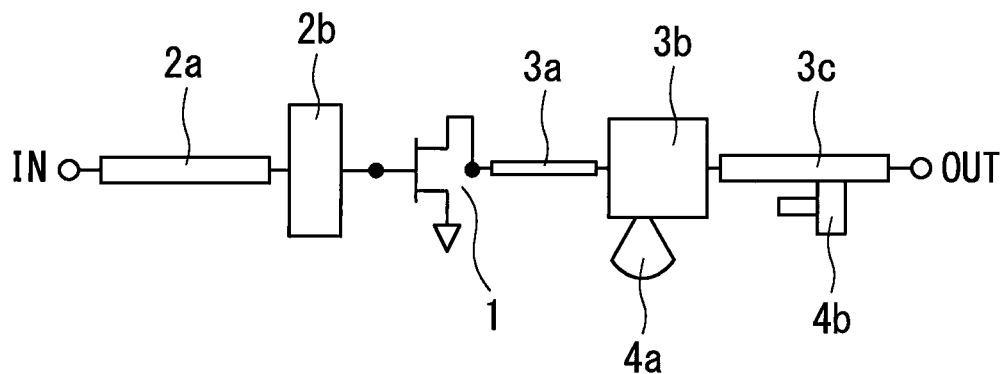
FIG. 10 is a diagram showing a power amplifier according to a fifth embodiment of the present invention.

FIG. 10 is a diagram showing a power amplifier according to a fifth embodiment of the present invention. The open stub 4a spreads at the tip thereof like a fan. As long as the tip of the open stub can be expanded, the open stub may be tapered, hook-shaped, L-shaped or the like. The open stub 4b is branched at the tip thereof. By broadening or branching the open stub as described above, it is possible to adjust the frequency band of the second harmonic of the power amplifier in which resonance occurs. Accordingly, as in the case of the fourth embodiment, the impedance of the second harmonic of the power amplifier can be gathered in a broader band as compared with the first embodiment. Therefore, the transistor can be caused to perform the inverse F class operation in a broad band, and it is possible to obtain a power amplifier having a high efficiency in a broader band. Note that the configuration of the present embodiment may be applied to only some open stubs or all open stubs. Also in the present embodiment, the matching circuit can be miniaturized as in the case of the first embodiment.

Sixth Embodiment

Figure 11:
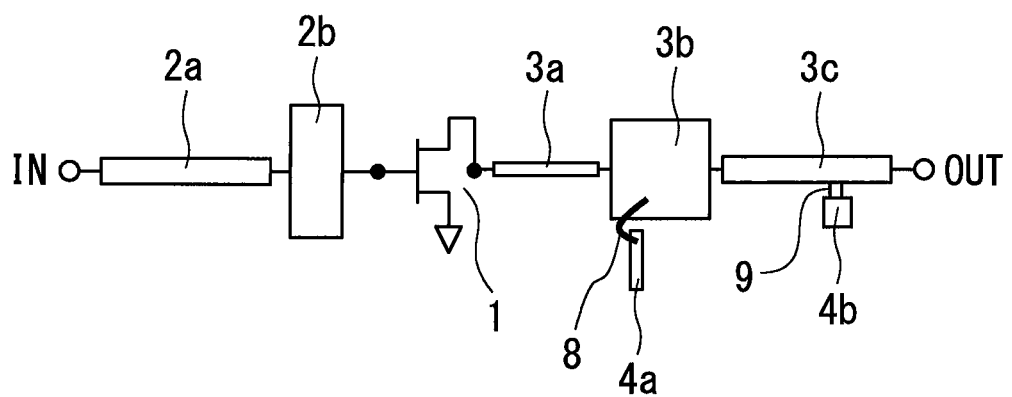
FIG. 11 is a diagram showing a power amplifier according to a sixth embodiment of the present invention.

FIG. 11 is a diagram showing a power amplifier according to a sixth embodiment of the present invention. The open stub 4a and the transmission line 3b are connected to each other by a wire 8 narrower than the open stub 4a. The open stub 4b and the transmission line 3c are connected to each other by a wiring pattern 9 narrower than the open stub 4b.

In the case of the inverse F class operation, it is necessary to match the second harmonic or even harmonics of the power amplifier to the open impedance. However, in the first to fifth embodiments, the second harmonic of the power amplifier can be taken in a broad band, but the phase of the second harmonic of the power amplifier cannot be sufficiently controlled.

In contrast, in the present embodiment, the phase of the second harmonic of the power amplifier can be easily controlled by inductor components of the wire 8 and the wiring pattern 9, so that the second harmonic of the power amplifier can easily be matched with a desired impedance such as an open impedance. Accordingly, a high-efficiency power amplifier which can be caused to ideally perform the inverse F class operation can be obtained. Note that the configuration of the present embodiment may be applied to only some open stubs or all open stubs. A ribbon may be used instead of the wire 8. Furthermore, by combining the configuration of the present embodiment with the first to fifth embodiments, it is possible to obtain a power amplifier which has a high efficiency in a broad band and can perform the inverse F class operation in a broad band. Also in the present embodiment, the matching circuit can be miniaturized as in the case of the first embodiment.

Seventh Embodiment

Figure 12:
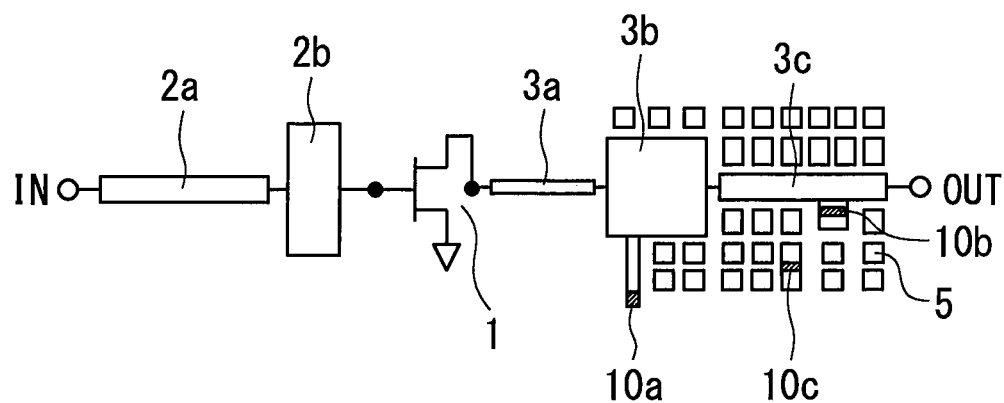
FIG. 12 is a diagram showing a power amplifier according to a seventh embodiment of the present invention.
Figure 13:
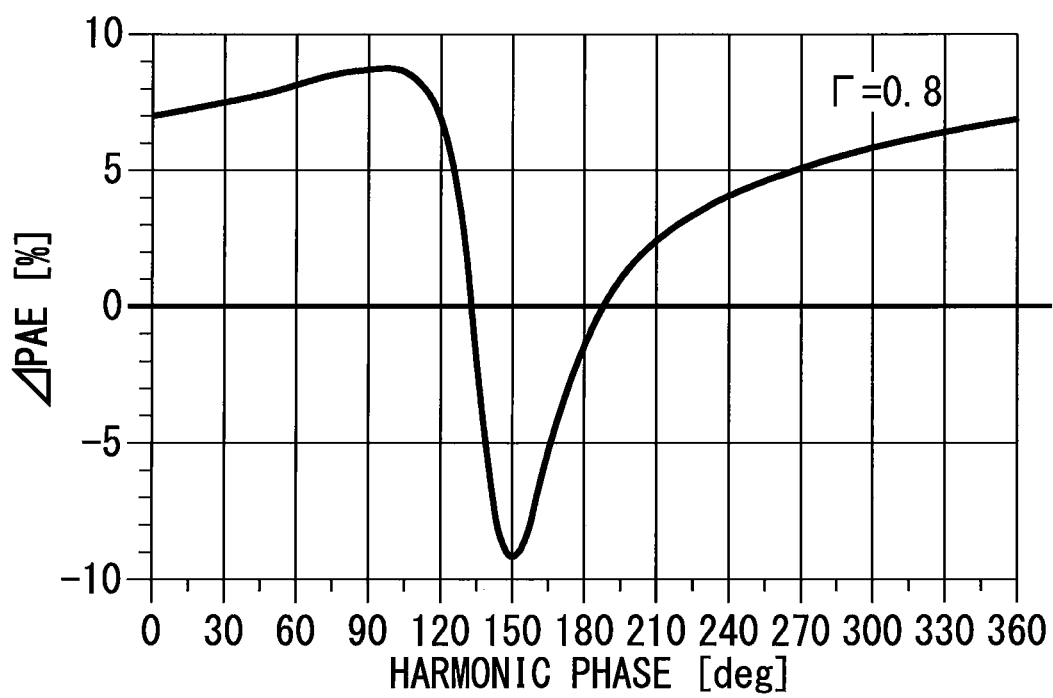
FIG. 13 is a diagram showing the amount of variation in power-added efficiency (PAE) of a transistor in a conventional power amplifier.

FIG. 12 is a diagram showing a power amplifier according to a seventh embodiment of the present invention. A resistance pattern 10a is connected to the tip of the open stub 4a. A resistance pattern 10b is connected to an intermediate portion of the open stub 4b. A resistance pattern 10c is connected between the non-grounded conductive patterns 5. By positively inserting the resistance patterns in this manner, F of the second harmonic of the power amplifier is smaller than 1, so that the enhancement of PAE of the power amplifier is lowered. However, since the fluctuation of the phase of the second harmonic can be reduced, a broadband power amplifier can be obtained. Furthermore, in the present embodiment, the matching circuit can be miniaturized as in the case of the first embodiment.

REFERENCE SIGNS LIST 1 transistor; 3a,3b,3c transmission line; 4a,4b,4c open stub; 5 non-grounded conductive pattern; 8 wire (wiring); 9 wiring pattern (wiring); 10a,10b,10c resistance pattern

The invention claimed is:
1. A power amplifier comprising:
a transistor;
a plurality of transmission lines connected to the transistor and having different characteristic impedances; and
a plurality of open stubs connected to the plurality of transmission lines respectively,
wherein a length of each open stub is shorter than a length of each transmission line, the open stub having shorter length is connected to the transmission line having higher characteristic impedance, the plurality of transmission lines are directly connected to each other in series, and at least one of the plurality of open stubs includes at least two open stubs having different lengths.

2. A power amplifier comprising:

a transistor;

a plurality of transmission lines connected to the transistor and having different characteristic impedances;

a plurality of open stubs connected to the plurality of transmission lines respectively; and ungrounded conductive patterns arranged around the plurality of transmission lines and the plurality of open stubs, wherein a length of each open stub is shorter than a length of each transmission line.

3. A power amplifier comprising:

a transistor;

a plurality of transmission lines connected to the transistor and having different characteristic impedances; and a plurality of open stubs connected to the plurality of transmission lines respectively, wherein a length of each open stub is shorter than a length of each transmission line, and the plurality of open stubs are arranged symmetrically with respect to a center line of the plurality of transmission lines.

4. The power amplifier according to claim 1, wherein the plurality of open stubs includes an open stub having a tip which spreads or is branched.

5. The power amplifier according to claim 1, further comprising wirings narrower than the open stubs and connecting the open stubs and the transmission lines.

6. A power amplifier comprising:

a transistor;

a plurality of transmission lines connected to the transistor and having different characteristic impedances;

a plurality of open stubs connected to the plurality of transmission lines respectively; and resistance patterns connected to tips or intermediate portions of the open stubs, wherein a length of each open stub is shorter than a length of each transmission line.

7. The power amplifier according to claim 2, further comprising resistance patterns connected between the conductive patterns.

8. The power amplifier according to claim 1, wherein the length of each open stub is ¼ of wavelength of second harmonic of the power amplifier.

9. The power amplifier according to claim 1, wherein the plurality of transmission lines are first and second transmission lines; and the plurality of open stubs are first and second open stubs connected to the first and second transmission lines respectively, a characteristic impedance of the first transmission line is higher than a characteristic impedance of the second transmission line, a length of the first open stub is ¼ of wavelength on a high frequency band side of second harmonic of the power amplifier, and a length of the second open stub is ¼ of wavelength on a low frequency band side of the second harmonic.

* * * * *